(12) United States Patent
Lim et al.

(10) Patent No.: US 8,653,580 B2
(45) Date of Patent: Feb. 18, 2014

(54) SEMICONDUCTOR DEVICES AND METHODS OF FABRICATING THE SAME

(75) Inventors: Joon-Sung Lim, Yongin-si (KR); Jongho Park, Seoul (KR); Okcheon Hong, Yongin-si (KR); Jung-Hwan Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/617,044

(22) Filed: Sep. 14, 2012

(65) Prior Publication Data

US 2013/0009213 A1 Jan. 10, 2013

Related U.S. Application Data

(62) Division of application No. 13/032,286, filed on Feb. 22, 2011, now Pat. No. 8,288,228.

(30) Foreign Application Priority Data

Feb. 22, 2010 (KR) .................. 10-2010-0015841

(51) Int. Cl.
*H01L 21/8247* (2006.01)

(52) U.S. Cl.
USPC .......................................... 257/316; 438/258

(58) Field of Classification Search
USPC ................... 257/315–321; 438/258
See application file for complete search history.

(56) References Cited

U.S. PATENT DOCUMENTS

| | | | |
|---|---|---|---|
| 4,623,912 A | | 11/1986 | Chang et al. |
| 5,670,431 A | * | 9/1997 | Huanga et al. ............... 438/396 |
| 5,789,293 A | * | 8/1998 | Cho et al. .................... 438/257 |
| 5,821,141 A | * | 10/1998 | Huang ........................ 438/253 |
| 6,476,488 B1 | * | 11/2002 | Jeng et al. .................... 257/751 |
| 6,548,418 B2 | * | 4/2003 | Lam et al. .................... 438/723 |
| 6,567,308 B2 | | 5/2003 | Yim et al. |
| 7,053,444 B2 | | 5/2006 | Prall et al. |
| 7,700,426 B2 | * | 4/2010 | Kim et al. .................... 438/201 |

FOREIGN PATENT DOCUMENTS

| | | |
|---|---|---|
| JP | 2009-016462 | 1/2009 |
| KR | 1020070052974 A | 5/2007 |
| KR | 1020070098330 A | 10/2007 |
| KR | 1020090004690 A | 1/2009 |

* cited by examiner

*Primary Examiner* — Richard Booth
(74) *Attorney, Agent, or Firm* — Myers Bigel Sibley & Sajovec, PA (57) ABSTRACT

Semiconductor devices and a methods of fabricating the semiconductor devices are provided. The semiconductor devices may include a pattern on a substrate. The semiconductor devices may also include a capping dielectric layer on the pattern. The semiconductor devices may further include a first nitride layer on the capping dielectric layer. Moreover, the semiconductor devices may include a second nitride layer on the first nitride layer. A concentration of nitrogen in the first nitride layer may be greater than that in the second nitride layer.

20 Claims, 12 Drawing Sheets

SEMICONDUCTOR DEVICES AND METHODS OF FABRICATING THE SAME

CROSS-REFERENCE TO RELATED APPLICATIONS

This U.S. non-provisional patent application is a divisional of U.S. patent application Ser. No. 13/032,286, filed on Feb. 22, 2011 now U.S. Pat. No. 8,288,228, which claims priority under 35 U.S.C. §119 to Korean Patent Application 10-2010-0015841, filed on Feb. 22, 2010, the contents of which are hereby incorporated by reference in their entireties.

BACKGROUND

The present disclosure herein relates to semiconductor devices and methods of fabricating the same.

Semiconductor devices are used in nearly all industrial fields and applications, including various electronic apparatuses, automobiles, and ships. Therefore, the semiconductor industry has become important in modern industry. As semiconductor devices have been used in various industrial fields and have become an important factor of determining the quality of electronic apparatuses, automobiles, ships, and the like, demand for semiconductor devices with excellent characteristics has increased. In order to meet such demand, semiconductor technologies have been developed to realize high integration, low power consumption, and/or high speed for semiconductor devices.

SUMMARY

Some embodiments of the present disclosure provide semiconductor devices that have excellent reliability and methods of fabricating the semiconductor devices.

Some embodiments of the present disclosure provide semiconductor devices that include improved storage capability and methods of fabricating the semiconductor devices.

Some embodiments provide a method of fabricating a semiconductor device. The method may include forming a pattern on a substrate. In some embodiments, the method may also include forming a capping dielectric layer on the pattern. According to some embodiments, the method may further include thermally processing the substrate. After thermally processing the substrate, the method may further include forming a diffusion barrier layer by a nitride process that includes supplying nitrogen to the capping dielectric layer. The method may also include forming an etching stop layer on the diffusion barrier layer, forming an inter-layer dielectric layer on the etching stop layer, and planarizing the inter-layer dielectric layer.

In some embodiments, the etching stop layer may include a first portion and a second portion, the second portion including a surface less distant from the substrate than the first portion. After the planarization, the planarized inter-layer dielectric layer may remain on the surface of the second portion and the first portion may be exposed.

In some embodiments, the pattern may include a string region and a resistance region.

In some embodiments, the string region may include a plurality of spaced-apart select lines and a plurality of spaced-apart word lines.

In some embodiments, the method may further include thermally processing the substrate before the planarization.

In some embodiments, the method may further include forming an auxiliary dielectric layer on the diffusion barrier layer before the etching stop layer is formed.

In some embodiments, the thickness of the etching stop layer may be greater than that of the diffusion barrier layer.

In some embodiments, the etching stop layer may include a nitride layer. The concentration of nitrogen in the diffusion barrier layer may be greater/higher than that of nitrogen in the etching stop layer.

In some embodiments, the pattern may further include a peripheral region that includes a peripheral gate pattern.

In some embodiments, supplying nitrogen to the capping dielectric layer may include implanting nitrogen into the capping dielectric layer.

In some embodiments, plasma may be used in the nitride process.

In some embodiments, the diffusion barrier layer may be formed of a compound that includes an element of the capping dielectric layer and the supplied nitrogen.

In some embodiments, forming the etching stop layer may include forming the etching stop layer by chemical vapor deposition or atomic layer deposition.

In some embodiments, the method may further include metal siliciding portions of the string region. According to some embodiments, the capping dielectric layer may be formed on the pattern after metal siliciding portions of the string region. According to some embodiments, the resistance region may include a resistance pattern.

In some embodiments, a semiconductor device may include a pattern disposed on a substrate, a capping dielectric layer disposed on the pattern, a first nitride layer disposed on the capping dielectric layer, and a second nitride layer disposed on the first nitride layer.

In some embodiments, the pattern may include select lines and word lines.

In some embodiments, the concentration of nitride in the first nitride layer may be greater/higher than that of nitride in the second nitride layer.

In some embodiments, the first and second nitride layers may contact each other along a boundary surface between the first and second nitride layers.

In some embodiments, the thickness of the first nitride layer may be less than that of the second nitride layer.

In some embodiments, the semiconductor device may further include an auxiliary dielectric layer interposed between the first and second nitride layers.

In some embodiments, the first nitride layer may be formed by a plasma nitride process and the second nitride layer may be formed by chemical vapor deposition or atomic layer deposition.

In some embodiments, a method of fabricating a semiconductor device may include forming a pattern on a substrate, and the pattern may include a string region and a resistance region. The method may also include metal siliciding portions of the string region. The method may further include, after metal siliciding the portions of the string region, forming a capping dielectric layer on the pattern. After forming the capping dielectric layer, the method may further include thermally processing the substrate. After thermally processing the substrate, the method may further include forming a diffusion barrier layer by a nitride process that may include supplying nitrogen to the capping dielectric layer. According to some embodiments, the method may also include forming an etching stop layer on the diffusion barrier layer, where the etching stop layer may include a nitride layer, and where a concentration of nitrogen in the diffusion barrier layer may be greater than that in the etching stop layer. According to some embodiments, the method may further include forming an inter-layer dielectric layer on the etching stop layer, and planarizing the inter-layer dielectric layer.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

DETAILED DESCRIPTION OF THE EMBODIMENTS

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 1G are cross-sectional views illustrating methods of fabricating a semiconductor device according to some embodiments. FIG. 2 is a flowchart illustrating methods of fabricating a semiconductor device according to some embodiments.

Figure 1A:
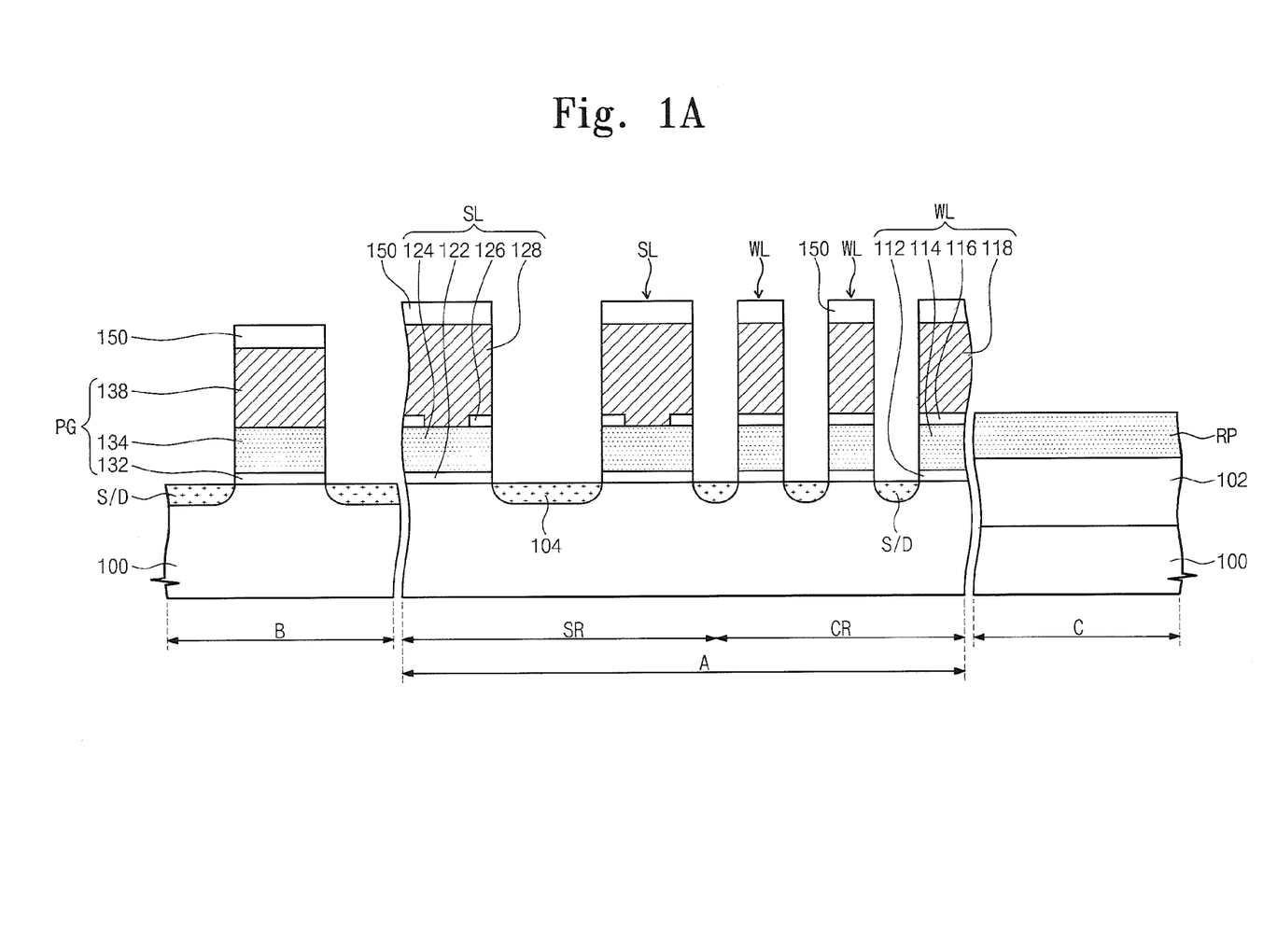
FIGS. 1A through 1G are cross-sectional views illustrating methods of fabricating a semiconductor device according to some embodiments.
Figure 2:
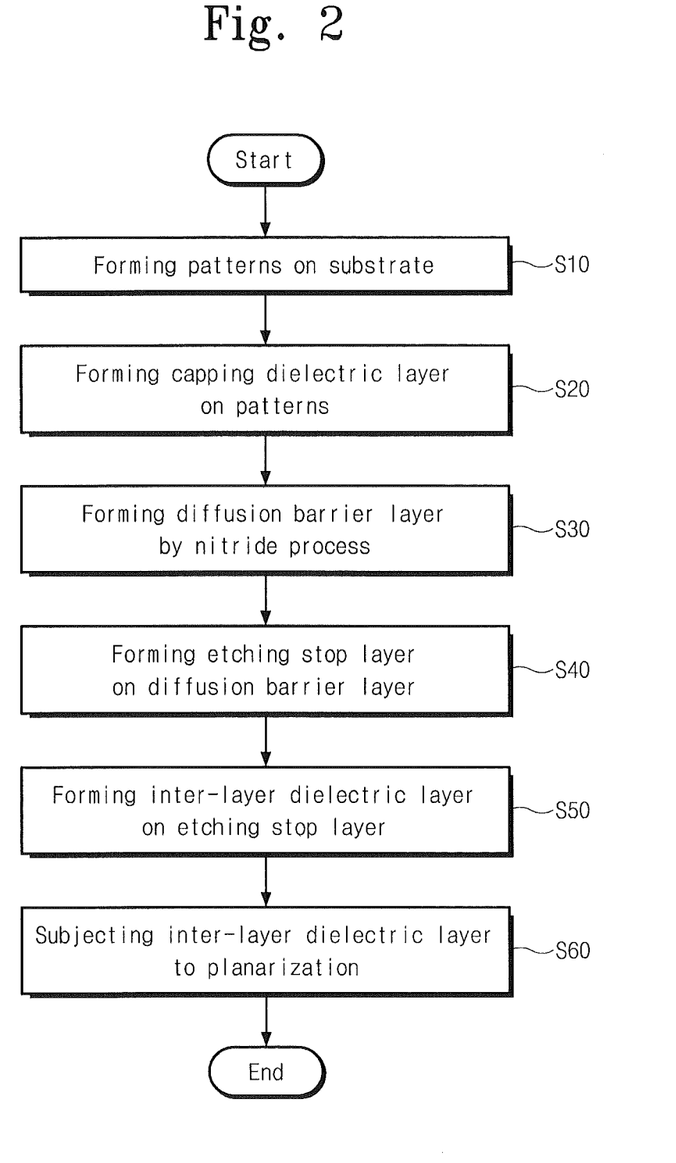
FIG. 2 is a flowchart illustrating methods of fabricating a semiconductor device according to some embodiments.

Referring to FIGS. 1A and 2, a substrate 100 may be prepared. The substrate 100 may include a semiconductor substrate. For example, the substrate 100 may include a silicon substrate, a germanium substrate, a silicon-germanium substrate, a compound substrate, or the like. The substrate 100 may be doped with a first type of dopants, such as p-type or n-type dopants.

The substrate 100 may include a string region A, a peripheral region B, and a resistance region C. The string region A, the peripheral region B, and the resistance region C may be distant from each other. Patterns may be formed on the substrate 100 of the string region A, the peripheral region B, and the resistance region C, respectively (FIG. 2, Block S10). For example, word lines WL and select lines SL may be formed on the string region A of the substrate 100. A peripheral gate pattern (PG) may be formed on the peripheral region B of the substrate 100. A resistance pattern RP may be formed on the resistance region C of the substrate 100.

The substrate 100 in the string region A may include an active region defined by a device isolating pattern 102. The active region may be a part of the substrate 100 surrounded by the device isolating pattern 102. The active region may extend in a first direction. The active region may include a channel region. A channel may be generated in the channel region. For example, a channel may be generated in the channel region at/during a time when the semiconductor device operates.

The string region A may include a memory cell region CR and a select region SR. At least one of the word lines WL may be formed on the memory cell region CR of the string region A. At least one of the select lines SL may be formed on the select region SR of the string region A. Gate hard mask patterns 150 may be formed on the word lines WL and the select lines SL.

On the substrate 100 in the memory cell region CR, the word lines WL may be distant from each other at a first interval. Source/drain regions S/D may be formed in/on the substrate 100 between adjacent ones of the word lines WL. The source/drain regions S/D may be regions doped with a second type of dopants, such as p-type or n-type dopants. The second type of dopants may be different from the first type of dopants with which the substrate 100 may be doped. For example, the first type may be p-type and the second type may be n-type, or vice versa.

Each of the word lines WL may include a tunnel insulating layer 112 that may be formed on the active region of the substrate 100, a charge storage pattern 114 that may be formed on the tunnel insulating layer 112, a blocking layer 116 that may be formed on the charge storage pattern 114, and a control gate electrode 118 that may be formed on the blocking layer 116. The tunnel insulating layer 112, the charge storage pattern 114, the blocking layer 116, and the control gate electrode 118 may be sequentially stacked on the substrate 100. The control gate electrode 118 may be disposed on the blocking layer 116 and may intersect the active region in a second direction intersecting the first direction in which the active region may extend.

The tunnel insulating layer 112 may include a single layer or multiple layers. For example, the tunnel insulating layer 112 may include at least one of a silicon oxynitride layer, a silicon nitride layer, a silicon oxide layer, or a metal oxide layer.

The charge storage pattern 114 may include doped polysilicon or undoped polysilicon. The charge storage pattern 114 may include charge trap sites capable of storing charges. For example, the charge storage pattern 114 may include at least one of a silicon nitride layer, a metal nitride layer, a metal oxynitride layer, a metal silicon oxide layer, a metal silicon oxynitride layer, or nanodots.

The blocking layer 116 may include a material with a dielectric constant higher than that of the tunnel insulating layer 112. The blocking layer 116 may include at least one of a silicon oxide layer, a silicon nitride layer, a silicon oxynitride layer, or a high-k layer. The high-k layer may include at least one of a metal oxide layer, a metal nitride layer, or a metal oxynitride layer. The high-k layer may include at least one of hafnium (Hf), zirconium (Zr), aluminum (Al), tantalum (Ta), lanthanum (La), cesium (Ce), praseodymium (Pr), or the like.

The control gate electrode 118 may include at least one of doped polysilicon, metal, metal silicide, or metal nitride. Examples of the metal silicide include tungsten silicide, titanium silicide, cobalt silicide, or tantalum silicide. Examples of the metal nitride include titanium nitride or tantalum nitride.

On the substrate 100 in the select region SR, the select lines SL may be distant from each other at a second interval that is larger than the first interval at which the word lines WL may be distant from each other in the memory cell region CR. An impurity region 104 may be formed between adjacent ones of the select lines SL. The select lines SL may be ground lines and/or string select lines. When the select lines SL are ground select lines, the impurity region 104 may be a common source region. Alternatively, when the select lines SL are string select lines, the impurity region 104 may be a common drain region.

The select lines SL may include a select gate insulating layer 122 that may be formed on the substrate 100 in the select region SR, a select gate inter-layer insulating layer 126 that may be formed on the select gate insulating layer 122, and select gate electrodes 124 and 128 that may be formed on the select gate insulating layer 122. The select gate electrodes 124 and 128 may include an upper select gate electrode 128 that may be formed on a lower select gate electrode 124. The upper select gate electrode 128 may be disposed on the lower select gate electrode 124 and may intersect the active region in the second direction.

The select gate insulating layer 122, the lower select gate electrode 124, the select gate inter-layer insulating layer 126, and the upper select gate electrode 128 may include the same materials as the tunnel insulating layer 112, the charge storage pattern 114, the blocking layer 116, and the control gate electrode 118, respectively. The select gate inter-layer insulating layer 126 may be patterned to bring the lower select gate electrode 124 into contact with the upper select gate electrode 128.

The peripheral gate pattern PG may be formed on the substrate 100 of the peripheral region B. The gate hard mask pattern 150 may be formed on the peripheral gate pattern PG. Source/drain regions S/D may be formed in/on the substrate 100 below both sidewalls of the peripheral gate pattern PG. The peripheral gate pattern PG may include a peripheral gate insulating layer 132 that may be formed on the substrate 100 and peripheral gate electrodes 134 and 138 that may be formed on the peripheral gate insulating layer 132. The peripheral gate electrodes 134 and 138 may include a lower peripheral gate electrode 134 that may be formed on the peripheral gate insulating layer 132 and an upper peripheral gate electrode 138 that may be formed on the lower peripheral gate electrode 134. The peripheral gate insulating layer 132, the lower peripheral gate electrode 134, and the upper peripheral gate electrode 138 may include the same materials as the tunnel insulating layer 112, the charge storage pattern 114, and the control gate electrode 118, respectively.

The resistance pattern RP may be formed on the device isolating pattern 102 that may be formed on the substrate 100 of the resistance region C. The resistance pattern RP may include the same material as that of the charge storage pattern 114.

Figure 1B:
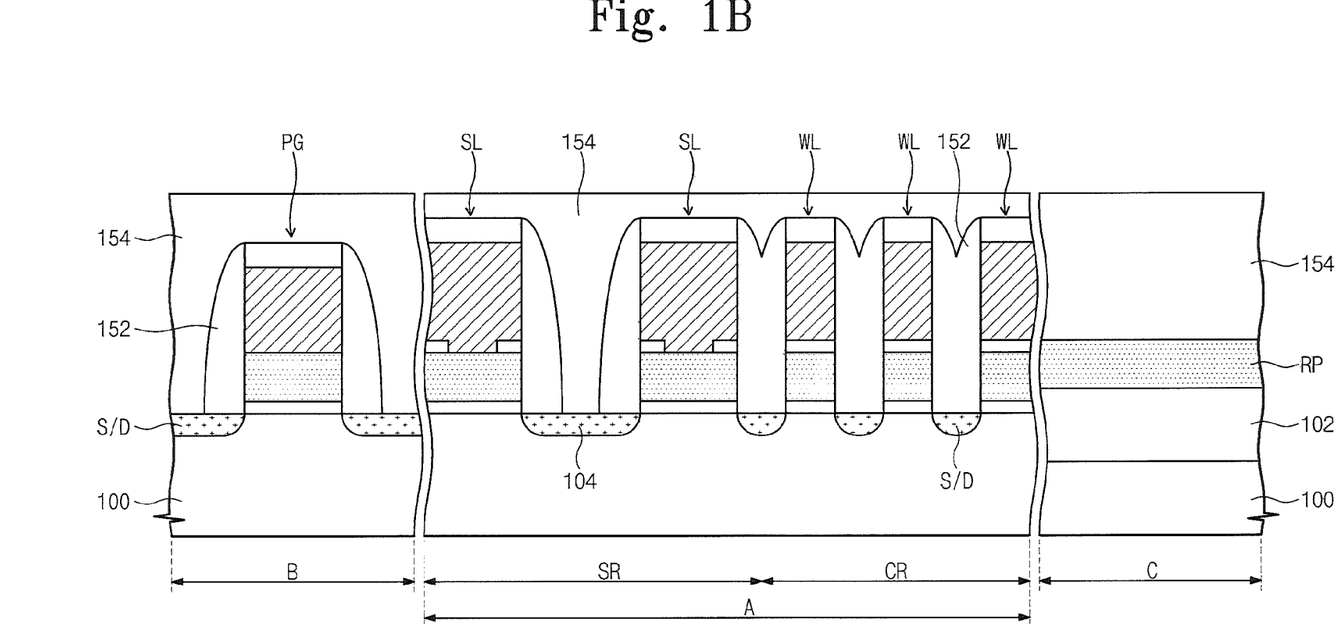

Referring to FIG. 1B, spacers 152 may be formed to cover sidewalls of the word lines WL, the select lines SL, and the peripheral gate pattern PG. Forming the spacers 152 may include forming a spacer layer on the entire surface of the substrate 100 and subjecting the spacer layer to anisotropic etching. The spacers 152 may include an insulating material.

After the spacers 152 are formed, an insulating layer 154 may be formed on the entire surface of the substrate 100. The insulating layer 154 may cover upper surfaces of the spacers 152, the word lines WL, the select lines SL, the peripheral gate pattern PG, and the resistance pattern RP.

Figure 1C:
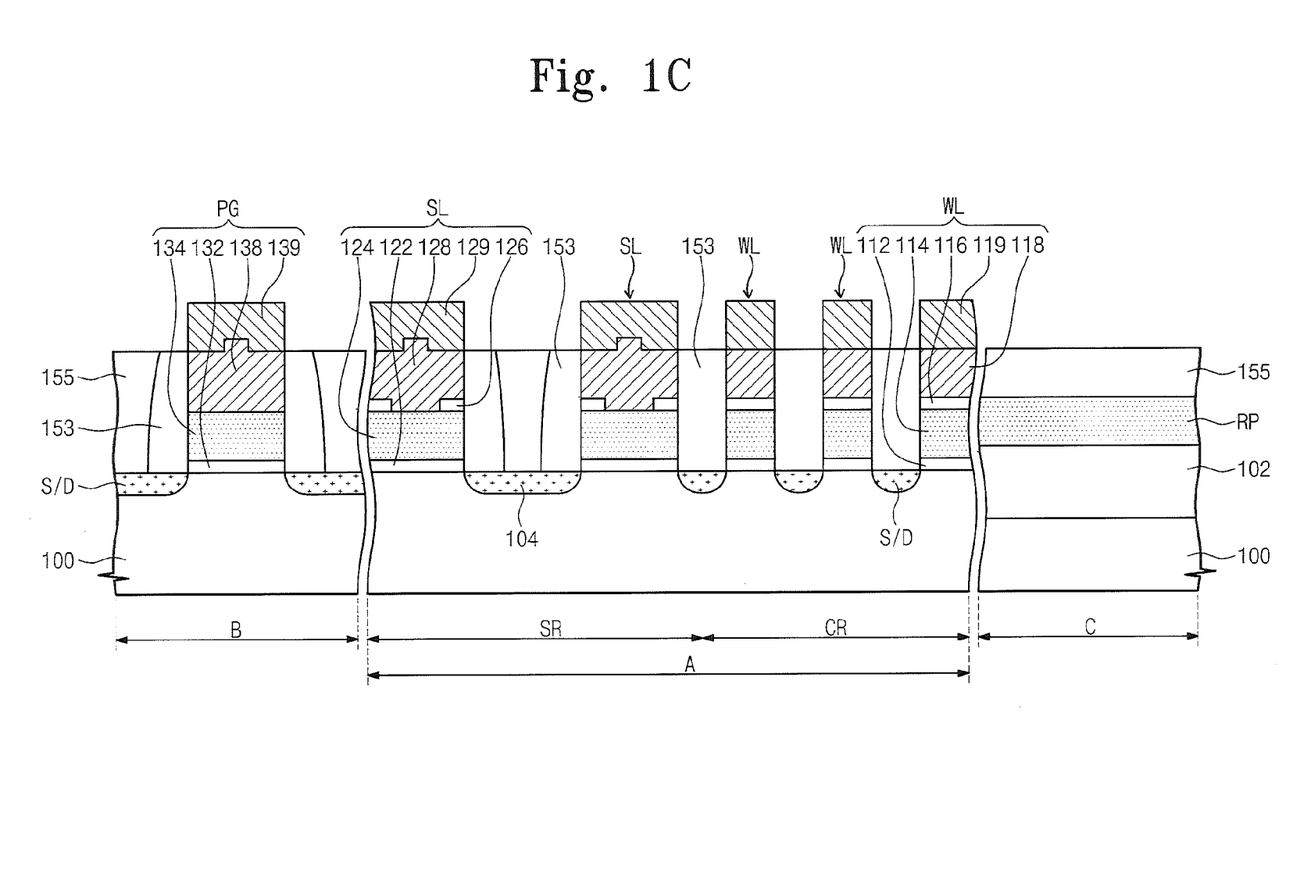

Referring to FIG. 1C, by performing a recess process, the gate hard mask pattern 150 may be removed, and the spacers 152 and the insulating layer 154 may be recessed. The recess process may expose an upper portion of the control gate electrode 118 of the word line WL, an upper portion of the upper select gate electrode 128 of the select line SL, and an upper portion of the upper peripheral gate electrode 138 of the peripheral gate pattern PG. After the recess process, recessed spacers 153 and/or a recessed insulating layer 155 may cover lower portions of the word lines WL, the select lines SL, and the peripheral gate pattern PG. The recessed spacers 153 and/or the recessed insulating layer 155 may remain between the adjacent word lines WL, between the adjacent select lines SL, and on the sidewall of the peripheral gate pattern PG. The recessed insulating layer 155 may remain on an upper surface of the resistance pattern RP. Therefore, the upper surface of the resistance pattern RP may not be exposed. Upper surfaces of the recessed spacers 153 and the recessed insulating layer 155 may form a coplanar surface with each other and may be substantially flat.

After the recess process, a metal silicide process may be performed on the upper portion of the control gate electrode 118 of word line WL, the upper portion of the upper select gate electrode 128 of the select line SL, and the upper portion of the upper select gate electrode 138 of the select gate pattern PG. The metal silicide process may be a cobalt silicide process. In the metal silicide process, the upper portion of the control gate electrode 118 of the exposed word line WL, the upper portion of the upper select gate electrode 128 of the select line SL, and the upper portion of the upper select gate electrode 138 of the select gate pattern PG may be metal-silicided. By the metal-siliciding, the word lines WL may further include a metal silicide control gate electrode 119, the select lines SL may further include a metal silicide select gate electrode 129, and the peripheral gate pattern PG may further include a metal silicide peripheral gate electrode 139. When the metal-siliciding is performed, the recess insulating layer 155 may remain on the resistance pattern RP. Therefore, the resistance pattern. RP may not be metal-silicided. After the metal-siliciding, the recessed insulating layer 155 remaining in the resistance region C may be removed. Alternatively, the recessed insulating layer 155 remaining in the resistance region C may not be removed after the metal-siliciding.

Figure 1D:
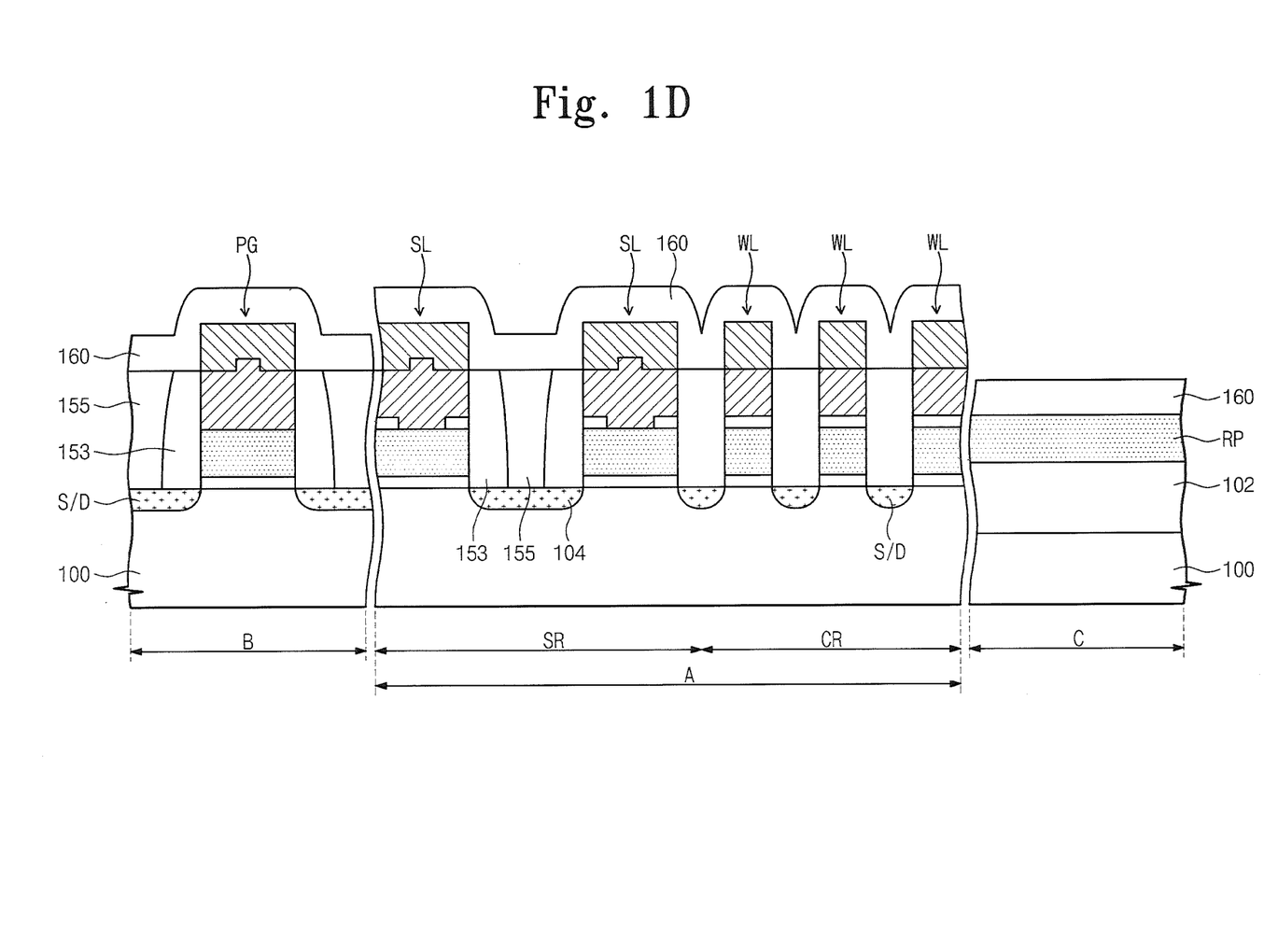

Referring to FIG. 1D, the recessed insulating layer 155 remaining in the resistance region C may be removed. Referring to FIGS. 1D and 2, a capping dielectric layer 160 may be formed on the substrate 100 in the string region A, the peripheral region B, and the resistance region C (FIG. 2, Block S20). The capping dielectric layer 160 may cover the exposed word lines WL, the exposed select lines SL, the exposed the peripheral gate pattern PG, and the exposed resistance pattern RP. The word lines WL, the select lines SL, the peripheral gate pattern PG, and the resistance pattern RP may be covered by the capping dielectric layer 160 such that they may not be exposed.

The capping dielectric layer 160 may be formed with a sufficient thickness so as not to receive a substantial influence of a subsequent nitride process 162 (see FIG. 1E) on the word lines WL, the select lines SL, the peripheral gate pattern PG, and the resistance pattern RP. For example, the capping dielectric layer 160 may be formed with a thickness of about 500 Å. The capping dielectric layer 160 may be a non-nitride layer. The capping dielectric layer 160 may be formed of a silicon oxide layer. The capping dielectric layer 160 may be formed by such methods as chemical vapor deposition (CVD) and atomic layer deposition (ALD). During the forming of the capping dielectric layer 160, a process residual gas may be generated. The generated residual gas may penetrate into the capping dielectric layer 160, the word lines WL, the select lines SL, the peripheral gate pattern PG, and the resistance pattern RP. The generated residual gas may be, for example, a hydrogen gas.

After the capping dielectric layer 160 is formed, the substrate 100 may be subjected to a first thermal processing. In the first thermal processing, the residual gas (for example, hydrogen), which may penetrate into the capping dielectric layer 160, the word lines WL, the select lines SL, the peripheral gate pattern PG, and the resistance pattern RP, may be removed.

If the first thermal processing is not performed, the residual gas (for example, hydrogen) generated during the deposition of the capping dielectric layer 160 may deteriorate the characteristics of the word lines WL, the select lines SL, the peripheral gate pattern PG, and the resistance pattern RP. However, according to some embodiments, in the first thermal processing, the process residual gas (for example, hydrogen) generated during the deposition of the capping dielectric layer 160 may be removed from the word lines WL, the select lines SL, the peripheral gate pattern PG, and the resistance pattern RP. Therefore, it is possible to provide semiconductor devices with high reliability.

Figure 1E:
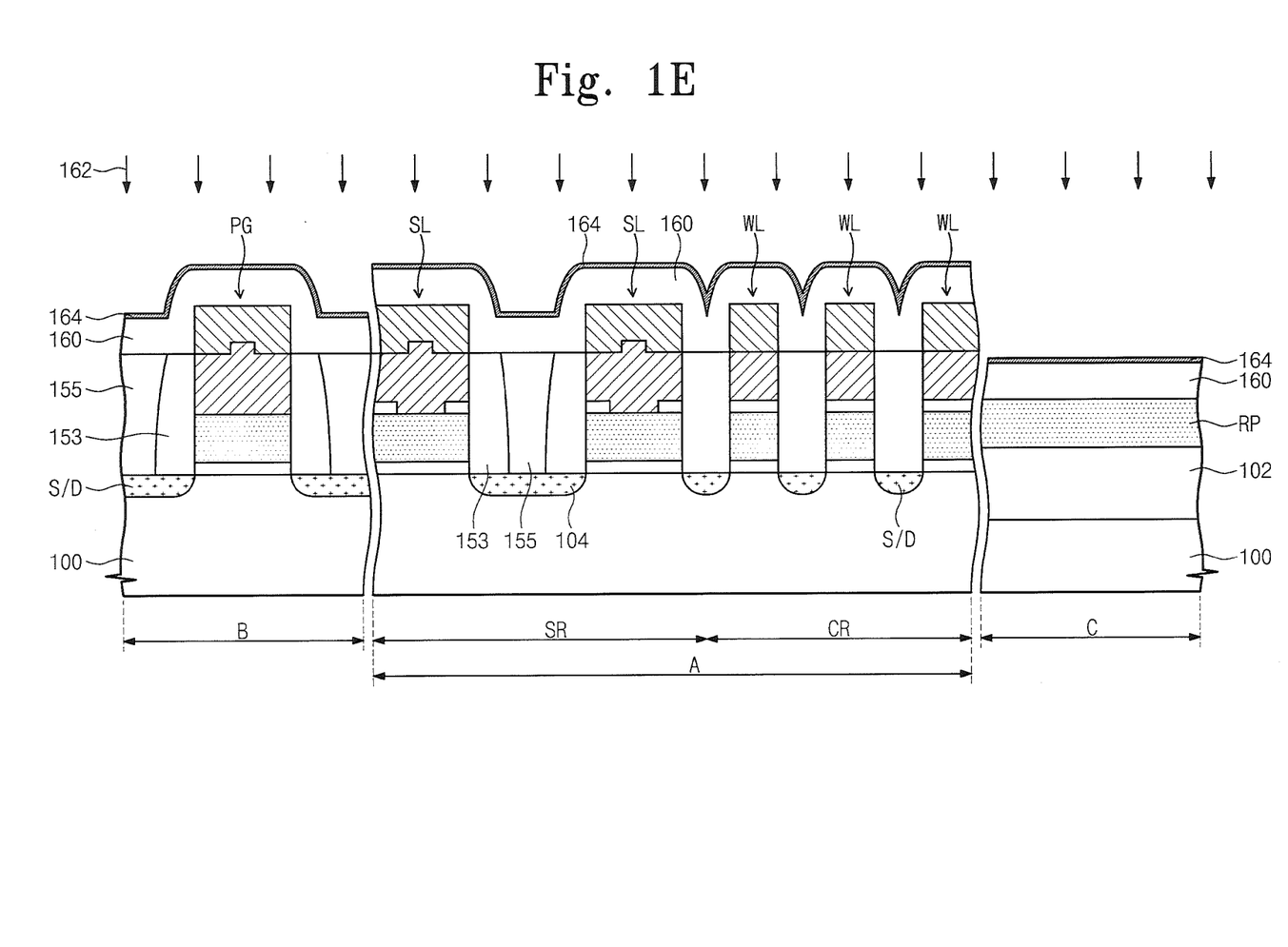

Referring to FIGS. 1E and 2, after the capping dielectric layer 160 is formed, the nitride process 162 may be performed (FIG. 2, Block S30). The nitride process 162 may be performed to supply nitrogen to the capping dielectric layer 160. A diffusion barrier layer 164 may be conformally formed on the capping dielectric layer 160. The diffusion barrier layer 164 may be formed on the capping dielectric layer 160 in the string region A, the peripheral region B, and the resistance region C.

The diffusion barrier layer 164 may include a compound having an element included in the capping dielectric layer 160 and the nitrogen implanted into the capping dielectric layer 160 by the nitride process 162. For example, if the capping dielectric layer 160 includes a silicon oxide layer, the diffusion barrier layer 164 may include a silicon oxynitride layer. The silicon and oxygen that may be included in the diffusion barrier layer 164 may be elements included in the capping dielectric layer 160. The thickness of the diffusion barrier layer 164 may be less than that of the capping dielectric layer 160. For example, the thickness of the capping dielectric layer 160 may be about 500 Å. The thickness of the diffusion barrier layer 164 may be in the range from about 30 Å to about 50 Å.

The nitride process 162 may be a plasma nitride process. For example, the plasma nitride process may be performed at temperature in the range from 600° C. to 650° C., at radio frequency (RF) power range from 500 W to 800 W, and at pressure range of 10 Pa to 20 Pa by use of a gas including a nitrogen concentration of 70% or more with respect to a process gas.

As described above, the diffusion barrier layer 164 may be formed by the nitride process 162 instead of a method of deposition such as CVD, physical vapor deposition (PVD), or ALD. So, the generation of process residual gas (for example, hydrogen) may be reduced/minimized. If the diffusion barrier layer 164 is formed by a method of deposition, the process residual gas generated during the forming of the diffusion barrier layer 164 may penetrate into the word lines WL, the select lines SL, the peripheral gate pattern PG, and the resistance pattern RP. And, because the process residual gas cannot easily pass through the diffusion barrier layer 164, quantities of the residual gas that may have penetrated into the patterns may not be easily extracted by thermal process. According to some embodiments, however, because the diffusion barrier layer 164 may be formed by subjecting the capping dielectric layer 160 to the nitride process, penetration of the process residual gas into the patterns may be reduced/minimized.

Figure 1F:
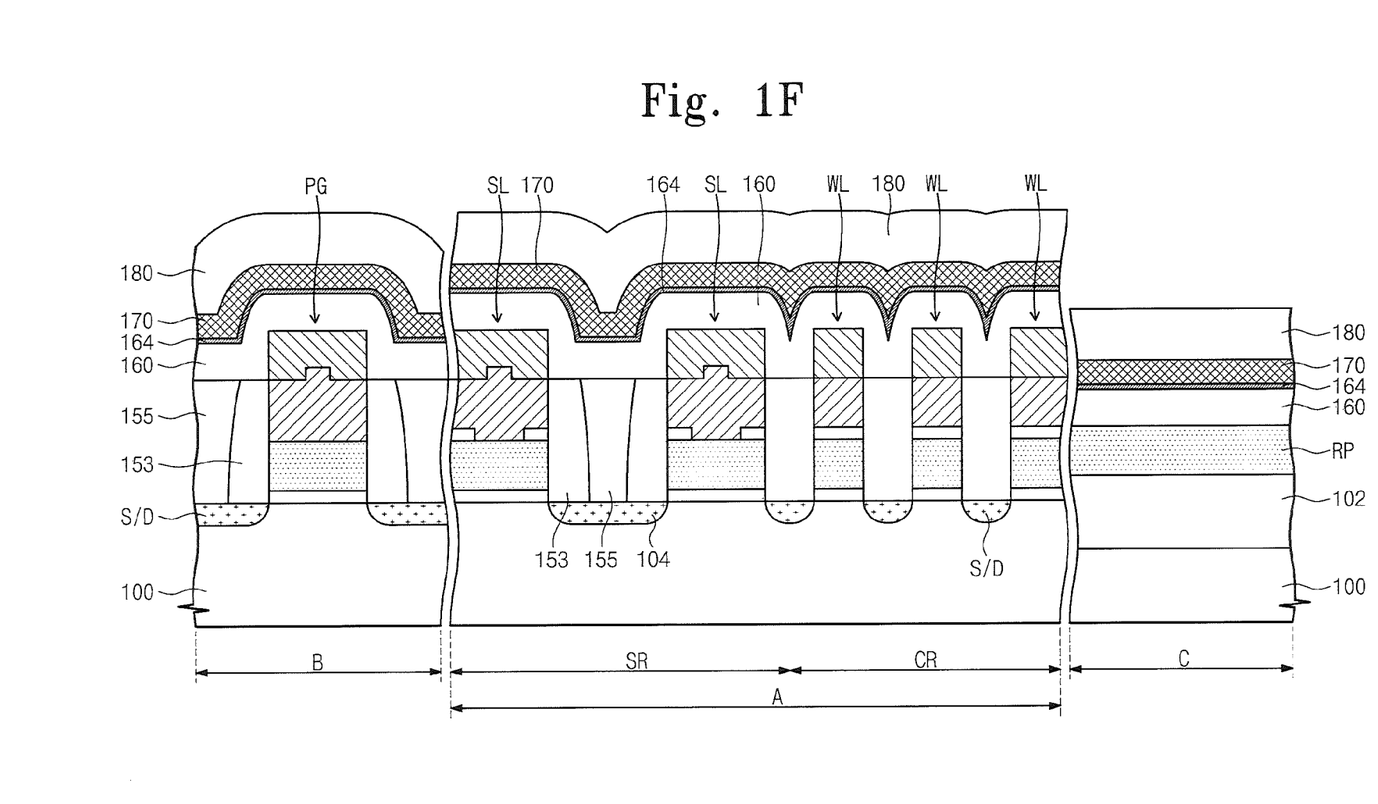

Referring to FIGS. 1F and 2, an etching stop layer 170 may be formed on the diffusion barrier layer 164 (FIG. 2, Block S40). In some embodiments, the etching stop layer 170 may be formed on the diffusion barrier layer 164 after performing the nitride process 162. The etching stop layer 170 may be formed by such methods as CVD and ALD. The etching stop layer 170 may include a silicon nitride layer. The concentration of nitrogen in the etching stop layer 170 may be less/lower than that of the concentration of nitrogen in the diffusion barrier layer 164. The thickness of the etching stop layer 170 may be greater than that of the diffusion barrier layer 164. For example, the thickness of the etching stop layer 170 may be in the range from 250 Å to 400 Å. The thickness of the diffusion barrier layer 164 may be in the range from 30 Å to 50 Å. The thickness of the etching stop layer 170 may be five to ten times greater than the thickness of the diffusion barrier layer 164.

The etching stop layer 170 may include first and second portions. The upper surface of the first portion may be at a higher level than that of the second portion from the top surface of the substrate 100. In other words, the first portion of the etching stop layer 170 may include a portion that is more distant from the substrate 100 than the second portion of the etching stop layer 170. The first portion of the etching stop layer 170 may include portions formed on the upper surfaces of the word lines WL, the select lines SL, and the gate pattern PG. The second portion may include portions of the etching stop layer 170 between the adjacent word lines WL, portions between the adjacent select lines SL, and portions on the source and drain S/D in the peripheral region B.

A process residual gas may be generated during the forming of the etching stop layer 170. The process residual gas may include, for example, hydrogen. According to some embodiments, the diffusion barrier layer 164 may reduce/minimize penetration of the residual gas (for example, hydrogen) generated during forming the etching stop layer 170 into the word lines WL, the select lines SL, the peripheral gate pattern PG, and the resistance pattern RP.

If the etching stop layer 170 is deposited without forming the diffusion barrier layer 164, the residual gas (for example, hydrogen) generated during the deposition of the etching stop layer 170 may penetrate into the word lines WL, the select lines SL, the peripheral gate pattern PG, and the resistance pattern RP, thereby deteriorating the characteristics of the device. According to some embodiments, however, the diffusion barrier layer 164 may be formed by subjecting the capping dielectric layer 160 to the nitride process, before the deposition of the etching stop layer 170, to reduce/minimize the penetration of the residual gas (for example, hydrogen) generated during forming the etching stop layer 170 into the word lines WL, the select lines SL, the peripheral gate pattern PG, and the resistance pattern RP. Accordingly, it is possible to realize semiconductor devices with high reliability.

An inter-layer dielectric layer 180 may be formed on the etching stop layer 170 (FIG. 2, Block S50). The inter-layer dielectric layer 180 may be formed by such methods as CVD and ALD. For example, the inter-layer dielectric layer 180 may include a tetraethyl orthosilicate (TEOS) layer deposited by plasma CVD. The thickness of the inter-layer dielectric layer 180 may be about 1000 Å. A process residual gas may be generated during the forming of the inter-layer dielectric layer 180. The generated residual gas may exist in the inter-layer dielectric layer 180. The process residual gas may include, for example, hydrogen.

The inter-layer dielectric layer 180 may be subjected to a second thermal processing. The second thermal processing may be performed under the same temperature and time specifications as those of the first thermal processing. The residual gas (for example, hydrogen) in the inter-layer dielectric layer 180 may be removed by the second thermal processing.

Figure 1G:
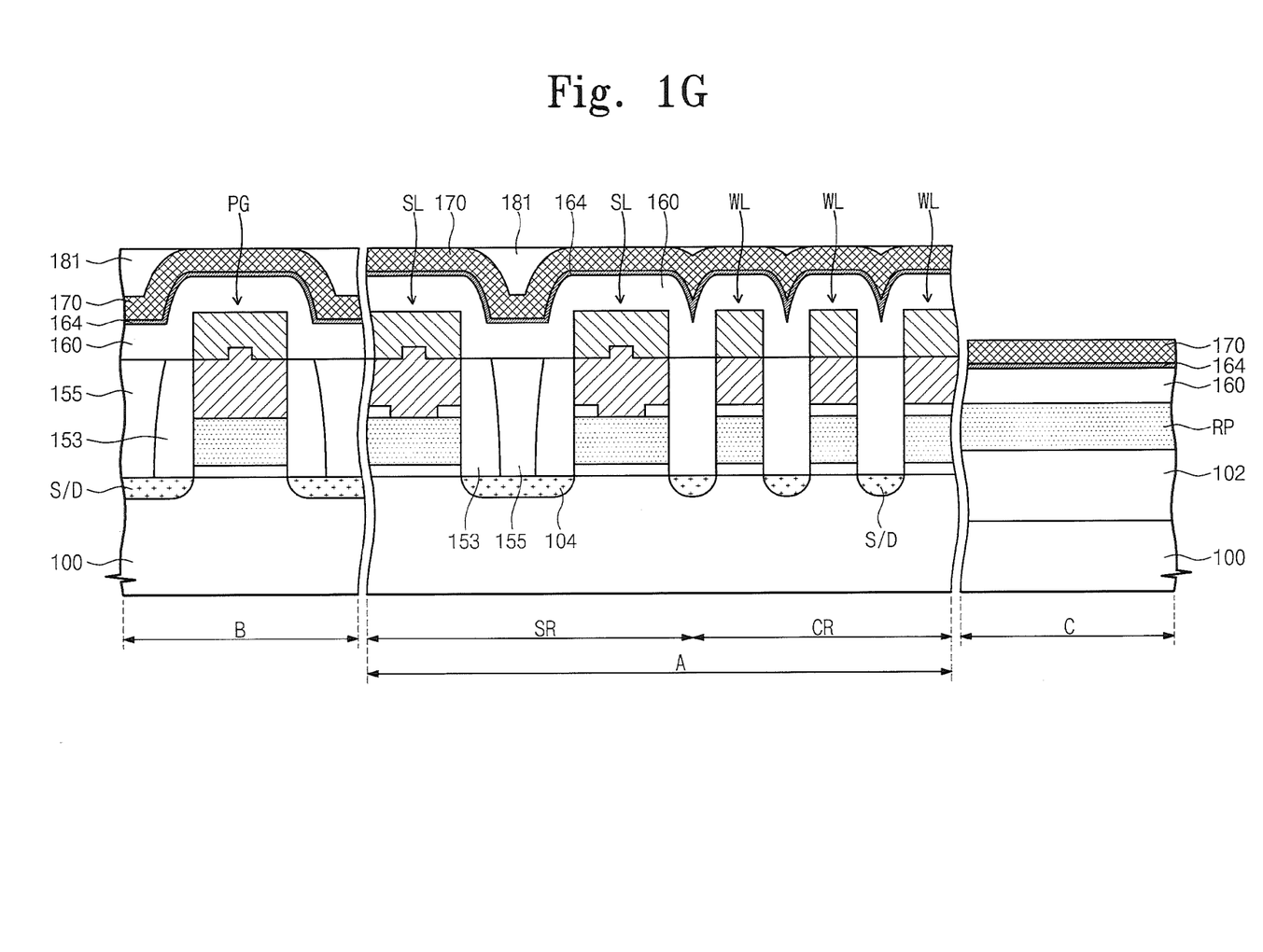

Referring to FIGS. 1G and 2, the inter-layer dielectric layer 180 may be planarized (FIG. 2, Block S60). For example, the inter-layer dielectric layer 180 may be planarized using the etching stop layer 170 as an etch stop. The planarization may be performed by chemical mechanical polishing (CMP) or etch back. After the planarization, the first portion of the etching stop layer 170 may be exposed. A planarized inter-layer dielectric layer 181 may remain on the second portion.

According to some embodiments, by performing the nitride process 162 to implant nitrogen into the capping dielectric layer 160, the diffusion barrier layer 164 may be formed to reduce/minimize the penetration of the process residual gas (for example, hydrogen) generated during the forming of the etching stop layer 170 into the word lines WL, the select lines SL, the peripheral gate pattern PG, and the resistance pattern RP. Accordingly, it is possible to realize semiconductor devices with high reliability.

Referring to FIG. 1G, semiconductor devices may be formed by the methods disclosed herein according to some embodiments.

Referring to FIG. 1G, the substrate 100 having the string region A, the peripheral region B, and the resistance region C may be prepared. The string region A may include the select region SR and the memory cell region CR.

The word lines WL, the select lines SL, and the peripheral gate pattern PG described with reference to FIG. 1C may be disposed on the substrate 100 in the memory cell region CR, the select region SR, and the peripheral region B, respectively. The resistance pattern RP described with reference to FIG. 1A may be disposed on the substrate 100 in the resistance region C. The recessed spacers 153 and the recessed insulating layer 155 described with reference to FIG. 1C may be disposed on the sidewalls of the word lines WL, the sidewalls of the select lines SL, and the sidewalls of the peripheral gate pattern PG.

The capping dielectric layer 160 may be disposed on the upper surfaces of the word lines WL, the select lines SL, the peripheral gate pattern PG, the resistance pattern RP, the recessed insulating layer 155, and the recessed spacers 153. A first nitride layer 164 and a second nitride layer 170 may be sequentially disposed on the capping dielectric layer 160. The first nitride layer 164 may be the above-described diffusion barrier layer 164. The second nitride layer 170 may be the above-described etching stop layer 170.

The concentration of nitride in the first nitride layer 164 may be greater/higher than the concentration of nitride in the second nitride layer 170. The first nitride layer 164 and the second nitride layer 170 may come into contact with each other. A boundary surface may exist between the first nitride layer 164 and the second nitride layer 170. The boundary surface may extend contiguously along the lengths of the first nitride layer 164 and the second nitride layer 170. Accordingly, the first nitride layer 164 and the second nitride layer 170 may contact each other along substantially the entire lengths of the first nitride layer 164 and the second nitride layer 170. The first nitride layer 164 and the second nitride layer 170 may be distinguished from each other by the boundary surface. The thickness of the first nitride layer 164 may be less than that of the second nitride layer 170. The first nitride layer 164 may be formed by subjecting the capping dielectric layer 160 to a plasma nitride process. The second nitride layer 170 may be formed by one of CVD and ALD.

Figure 3:
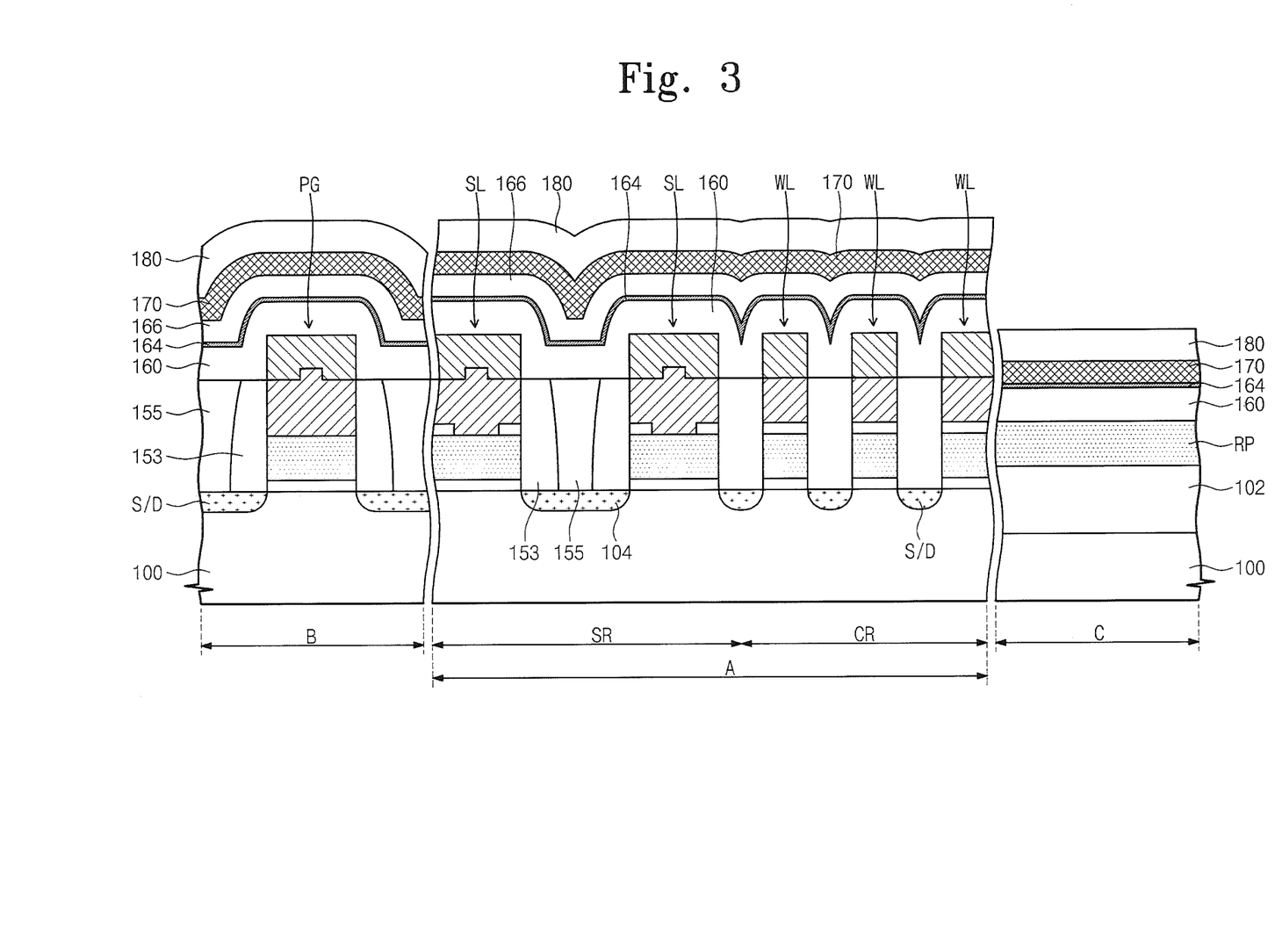
FIG. 3 is a cross-sectional view illustrating methods of fabricating a semiconductor device according to some embodiments.

FIG. 3 is a cross-sectional view illustrating methods of fabricating semiconductor devices according to some embodiments.

Referring to FIG. 3, the methods of fabricating semiconductor devices may include the methods of fabricating semiconductor devices described with reference to FIGS. 1A through 1E. After the diffusion barrier layer 164 is formed in the nitride process 162, an auxiliary dielectric layer 166 may be formed on the diffusion barrier layer 164. The auxiliary dielectric layer 166 may be a non-nitride layer. For example, the auxiliary dielectric layer 166 may include a silicon oxide layer. A process residual gas (for example, hydrogen) may be generated during the forming of the auxiliary dielectric layer 166. The diffusion barrier layer 164 may minimize penetration of the generated residual gas (for example, hydrogen) into the word lines WL, the select lines SL, the peripheral gate pattern PG, and the resistance pattern RP. The generated residual gas (for example, hydrogen) may exist in the auxiliary dielectric layer 166. After the auxiliary dielectric layer 166 is formed, the substrate 100 may be subjected to thermal processing. By performing the thermal processing, the residual gas (for example, hydrogen) existing in the auxiliary dielectric layer 166 may be removed. After performing the thermal processing, methods of fabricating semiconductor devices described with reference to FIGS. 1F and 1G may be performed.

Referring to FIG. 3, semiconductor devices formed by methods according to FIG. 3 may be similar to semiconductor devices described with reference to FIG. 1G. The differences, however, include that the auxiliary dielectric layer 166 of FIG. 3 may be disposed between the first nitride layer 164 and the second nitride layer 170. Accordingly, the first nitride layer 164 and the second nitride layer 170 may be distant from each other and may be separated by the auxiliary dielectric layer 166.

Figure 4:
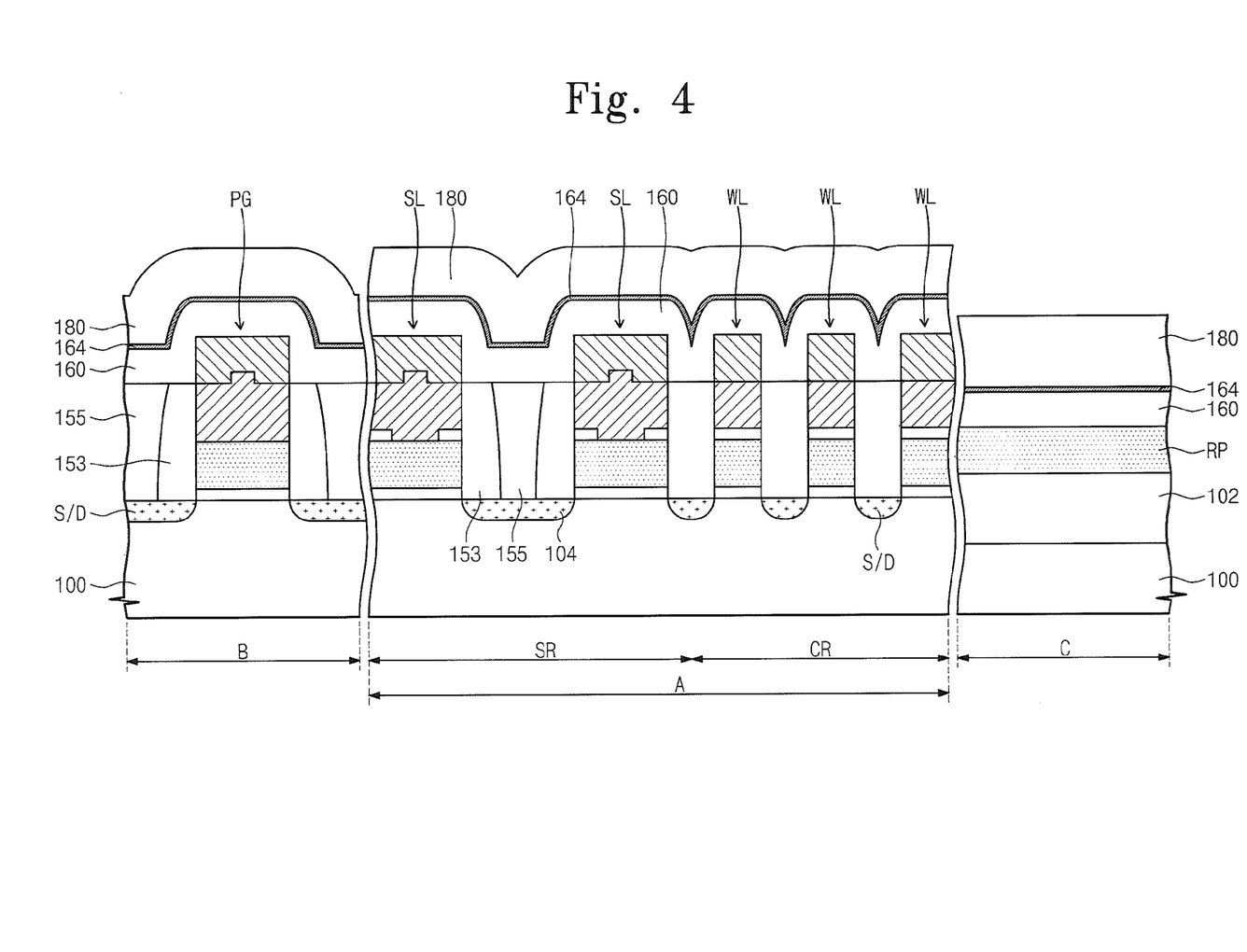
FIG. 4 is a cross-sectional view illustrating methods of fabricating a semiconductor device according to some embodiments.

FIG. 4 is a cross-sectional view illustrating methods of fabricating semiconductor devices according to some embodiments.

Referring to FIG. 4, methods of fabricating semiconductor devices may include methods of fabricating semiconductor devices described with reference to FIGS. 1A through 1E. According to some embodiments, after the diffusion barrier layer 164 is formed by the nitride process 162, the etching stop layer 170 may not be formed, and the inter-layer dielectric layer 180 may be formed on the diffusion barrier layer 164 by methods of fabricating the semiconductor device described with reference to FIG. 1F. The inter-layer dielectric layer 180 may come into contact with the diffusion barrier layer 164. After the inter-layer dielectric layer 180 is formed, the second thermal processing described with reference to FIG. 1F may be performed. Subsequently, the inter-layer dielectric layer 180 may be planarized using the diffusion barrier layer 164 as an etch stop layer.

Referring to FIG. 4, semiconductor devices formed by methods according to FIG. 4 may be similar to semiconductor devices described with reference to FIG. 1G. Unlike semiconductor devices illustrated in FIG. 1G, however, the second nitride layer 170 (see FIG. 1G) may be omitted. Accordingly, the first nitride layer 164 may contact the inter-layer dielectric layer 180.

The semiconductor devices according to some embodiments may be realized in various types of packages. For example, packaging of the semiconductor devices may include package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP). The package mounted with a semiconductor device may further include a controller and/or a logic device controlling the semiconductor device.

Figure 5:
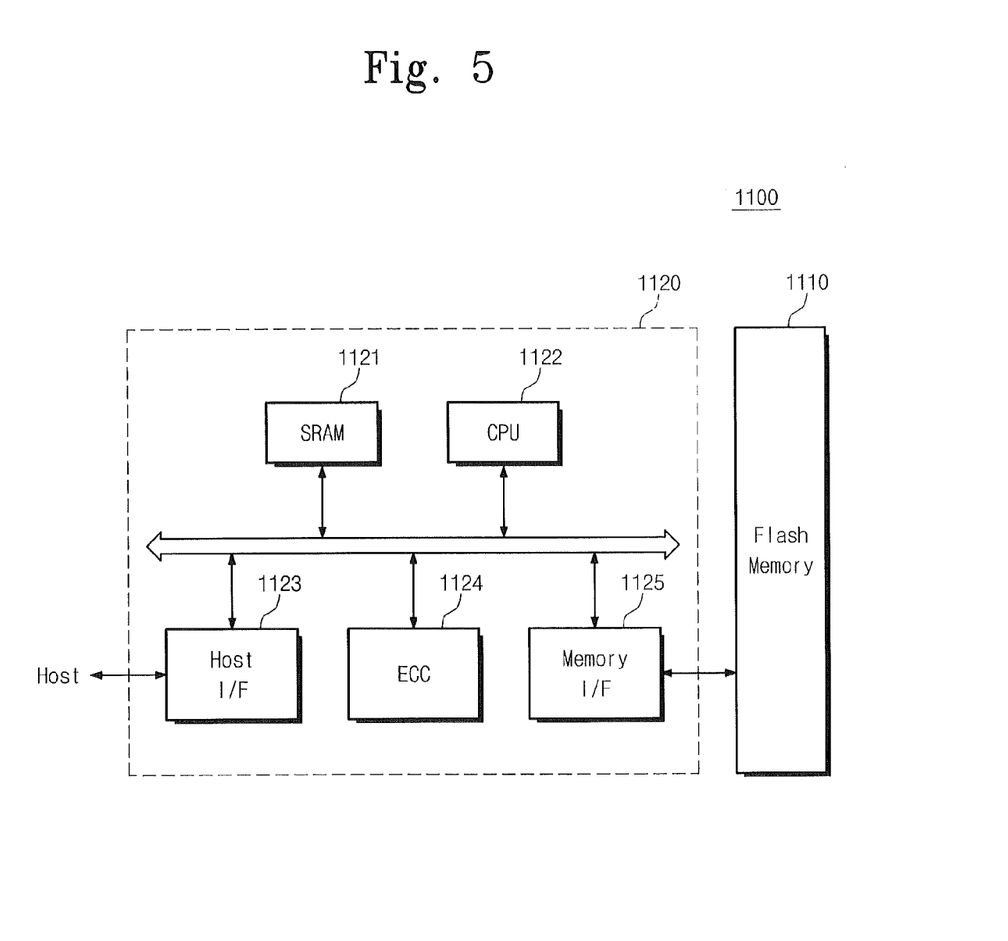
FIG. 5 is a block diagram illustrating a memory card including a semiconductor device according to some embodiments.

FIG. 5 is a block diagram illustrating a memory card including a semiconductor device according to some embodiments.

Referring to FIG. 5, a memory card 1100 according to some embodiments may include a memory device 1110. The memory device 1110 may include at least one of the semiconductor devices according to some embodiments. The memory device 1110 may further include another semiconductor device (for example, a DRAM device and/or an SRAM device). The memory device 1110 may include a flash memory. Moreover, the memory card 1100 may include a memory controller 1120 that may generally control data exchanges between a host and the memory device 1110.

The memory controller 1120 may include a processing unit 1122 that may generally control the operation of the memory card 1100. The memory controller 1120 may include an SRAM 1121 that may be used as a work memory of the processing unit 1122. The memory controller 1120 may further include a host interface 1123 and a memory interface 1125. The host interface 1123 may have a protocol exchanging data between the memory card 1100 and the host. The memory interface 1125 may connect the memory controller 1120 to the memory device 1110. The memory controller 1120 may further include an error correction block (Ecc) 1124. The error correction block 1124 may detect and correct errors of the data read from the memory device 1110. Although not illustrated, the memory card 1100 may further include a ROM device storing code data for interfacing with the host. The memory card 1100 may be used as a portable data storing card. Alternatively, the memory card 1100 may be realized as a solid state disk (SSD) replacing a hard disk drive of a computer system.

Figure 6:
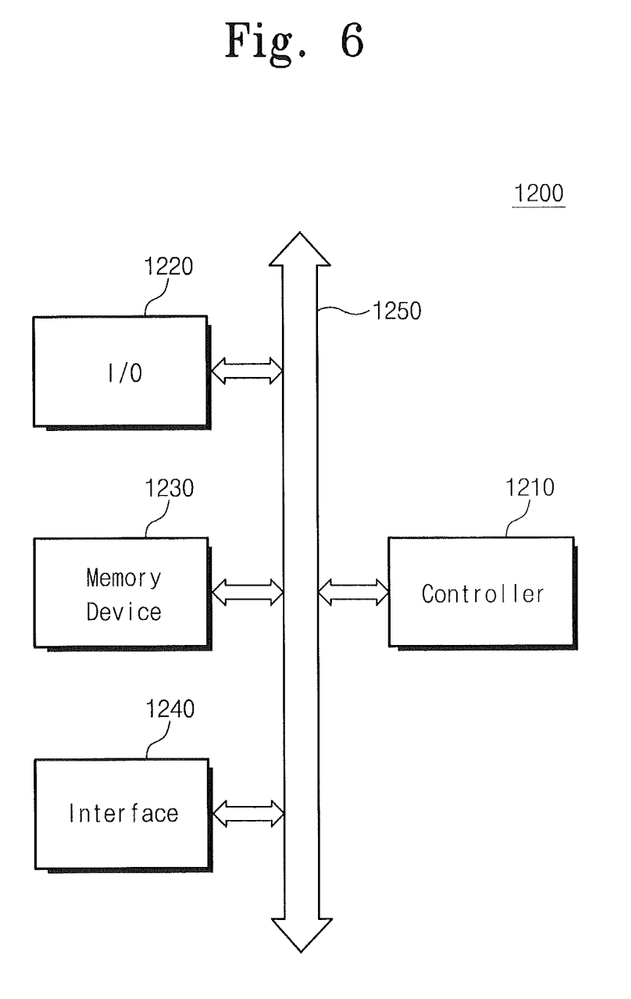
FIG. 6 is a block diagram illustrating an electronic system including a semiconductor device according to some embodiments.

FIG. 6 is a block diagram illustrating an electronic system including a semiconductor device according to some embodiments.

Referring to FIG. 6, an electronic system 1200 according to some embodiments may include a controller 1110, an input/output (I/O) device 1120, a memory device 1130, an interface 1140, and a bus 1260. The controller 1110, the input/output (I/O) device 1120, the memory device 1130, and/or the interface 1140 may be connected to each other via the bus 1260. The bus 1260 may correspond to a path through which data are transferred and received.

The controller 1110 may include at least one of a microprocessor, a digital signal processor, a microcontroller, and logic units capable of carrying out a similar function. The I/O device 1120 may include a keypad, a keyboard, a display device, or the like. The memory device 1130 may store data and/or commands. The memory device 1130 may include at least one of the semiconductor memory devices described according to some embodiments herein. The memory device 1130 may further include another semiconductor memory device (for example, a DRAM device and/or an SRAM device). The interface 1140 may execute a function of transmitting data to a communication network or receiving data from a communication network. The interface 1140 may be realized in a wired or wireless form. For example, the interface 1140 may include an antenna, a wired/wireless transceiver, or the like. Although not illustrated, the electronic system 1200 may further include a DRAM device and/or an SRAM device as a work memory device for improving the operation of the controller 1110.

The electronic system 1200 may be applicable to a PDA (Personal Digital Assistant), a portable computer, a web tablet, a wireless phone, a mobile phone, a digital music player, a memory card, or any electronic device capable of transmitting and/or receiving information in a wireless environment.

According to some embodiments, the capping dielectric layer 160 may be formed on the patterns of the substrate 100, and the diffusion barrier layer 164 may be formed by the nitride process 162 of implanting nitrogen into the capping dielectric layer 160. The diffusion barrier layer 164 may reduce/minimize penetration of the process residual gases generated in subsequent processes into the patterns. Accordingly, it is possible to realize semiconductor devices with excellent reliability.

Although the present disclosure has been described in connection with embodiments illustrated in the accompanying drawings, it will be apparent to those skilled in the art that various substitutions, modifications, and changes may be made thereto without departing from the scope and spirit of the disclosure. Accordingly, the above-disclosed embodiments are to be considered illustrative and not restrictive.

What is claimed is:

1. A semiconductor device, comprising:
   a pattern on a substrate;
   a non-nitride capping dielectric layer on the pattern;
   a first nitride layer contacting the non-nitride capping dielectric layer and configured to reduce penetration of process residual gas into the pattern; and
   a second nitride layer on the first nitride layer,
   wherein a concentration of nitrogen in the first nitride layer is greater than that in the second nitride layer.

2. The semiconductor device of claim 1, wherein the first and second nitride layers contact each other along a boundary surface between the first and second nitride layers.

3. The semiconductor device of claim 1, further comprising:
   a non-nitride auxiliary dielectric layer between the first and second nitride layers.

4. The semiconductor device of claim 1, wherein the first nitride layer is formed by a plasma nitride process and the second nitride layer is formed by chemical vapor deposition or atomic layer deposition.

5. The semiconductor device of claim 1, further comprising:
   an inter-layer dielectric layer on the second nitride layer.

6. The semiconductor device of claim 5, wherein the first nitride layer comprises a diffusion barrier layer, and wherein the second nitride layer comprises an etching stop layer.

7. The semiconductor device of claim 6, wherein the pattern includes a string region and a resistance region.

8. The semiconductor device of claim 7, wherein the string region includes a plurality of spaced-apart select lines and a plurality of spaced-apart word lines.

9. The semiconductor device of claim 6, wherein the etching stop layer includes a first portion and a second portion, the second portion including a surface less distant from the substrate than the first portion.

10. The semiconductor device of claim 6, wherein a thickness of the etching stop layer is greater than that of the diffusion barrier layer.

11. The semiconductor device of claim 7, wherein the pattern further includes a peripheral region including a peripheral gate pattern.

12. The semiconductor device of claim 6, wherein the diffusion barrier layer includes a compound that includes nitrogen and an element of the non-nitride capping dielectric layer.

13. The semiconductor device of claim 7, wherein the string region comprises metal-silicided portions, and wherein the resistance region includes a resistance pattern.

14. The semiconductor device of claim 1, wherein:
    the second nitride layer comprises a thickness that is at least about five times greater than a thickness of the first nitride layer;
    the thickness of the first nitride layer is in a range from about three nanometers to about five nanometers; and
    the thickness of the second nitride layer is in a range from about twenty-five nanometers to about forty nanometers.

15. The semiconductor device of claim 1, wherein the non-nitride capping dielectric layer comprises oxygen, and wherein the first nitride layer comprises oxygen.

16. The semiconductor device of claim 1, wherein the first nitride layer comprises oxygen.

17. The semiconductor device of claim 8, wherein the diffusion barrier layer is conformally formed on the spaced-apart select lines and the spaced-apart word lines.

18. The semiconductor device of claim 6, wherein the etching stop layer is conformally formed on the diffusion barrier layer.

19. The semiconductor device of claim 1, wherein:
    the pattern comprises a plurality of word lines on the substrate; and
    the non-nitride capping dielectric layer is on the plurality of word lines.

20. The semiconductor device of claim 1, wherein:
    the first nitride layer overlies the non-nitride capping dielectric layer; and
    the second nitride layer overlies the first nitride layer.

* * * * *